(12) United States Patent
Fujimoto et al.

(10) Patent No.: US 6,693,347 B2
(45) Date of Patent: Feb. 17, 2004

(54) SEMICONDUCTOR DEVICE

(75) Inventors: Hiroaki Fujimoto, Osaka (JP);
Yoshinobu Kunitomo, Kyoto (JP);
Takashi Yui, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/320,405

(22) Filed: Dec. 17, 2002

(65) Prior Publication Data
US 2003/0089972 A1 May 15, 2003

Related U.S. Application Data

(63) Continuation of application No. 09/946,363, filed on Sep. 6, 2001, now Pat. No. 6,509,638.

(30) Foreign Application Priority Data

Sep. 7, 2000 (JP) ........................................ 2000-271113

(51) Int. Cl.[7] ............................................... H01L 23/02
(52) U.S. Cl. .................... 257/686; 257/678; 257/685; 257/734; 257/737; 257/738; 257/777; 257/778; 257/784; 257/786
(58) Field of Search ................................ 257/678, 690, 257/734, 737, 738, 773, 777, 778, 684, 686, 685

(56) References Cited

U.S. PATENT DOCUMENTS

| 6,144,101 A | 11/2000 | Akram |
| 6,157,080 A | 12/2000 | Tamaki et al. |
| 6,258,626 B1 | 7/2001 | Wang et al. |
| 6,274,930 B1 | 8/2001 | Vaiyapuri et al. |
| 6,353,263 B1 | 3/2002 | Dotta et al. |
| 2002/0004258 A1 | 1/2002 | Nakayama et al. |
| 2002/0050635 A1 | 5/2002 | Ogura et al. |

FOREIGN PATENT DOCUMENTS

| JP | 63-211663 | 9/1988 |
| JP | 05-047998 | 2/1993 |
| JP | 05-259374 | 10/1993 |
| JP | 07-086495 | 3/1995 |

*Primary Examiner*—Nathan J. Flynn
*Assistant Examiner*—Pershelle Greene
(74) *Attorney, Agent, or Firm*—Nixon Peabody LLP; Donald R. Studebaker

(57) ABSTRACT

A semiconductor device includes: a wiring board; a first semiconductor chip, which has a circuitry side and a non-circuitry side that face each other vertically and which is electrically connected to the wiring board via a raised electrode, the circuitry side of the first chip facing the principal surface of the wiring board; and a second semiconductor chip, which has a circuitry side and a non-circuitry side that face each other vertically and which includes an external electrode on the circuitry side thereof. The non-circuitry sides of the first and second semiconductor chips are secured to each other. The external electrode of the second semiconductor chip is connected to the wiring board via a metal fine wire. The external and raised electrodes are so disposed as not to overlap each other as viewed vertically downward from over the principal surface of the wiring board.

2 Claims, 6 Drawing Sheets

SEMICONDUCTOR DEVICE

BACKGROUND OF THE INVENTION

The present invention relates to a semiconductor device in which a stack of semiconductor chips is mounted on a wiring board.

Recently, to downsize electronic units and improve the reliability thereof, a semiconductor device in which multiple semiconductor chips are included in one package has been in high demand. In view of this, to realize high performance and high packaging density, a semiconductor device (an LSI package) made by stacking a plurality of semiconductor chips on a wiring board has attracted more and more attention.

Hereinafter, a known semiconductor device will be described with reference to the drawing.

FIG. 6 shows a cross-sectional structure for a known semiconductor device with a stack of LSI chips. As shown in FIG. 6, first and second LSI chips 102 and 103 are secured to each other on a wiring board 101 so that the non-circuitry sides of these chips 102 and 103 face each other, i.e., so that the top of the chip 102 faces the bottom of the chip 103.

The circuitry side of the first LSI chip 102 faces the principal surface of the wiring board 101 and is electrically connected to the wiring board 101 via raised electrodes 104. In other words, the first LSI chip 102 is flip-chip bonded to the wiring board 101. External electrodes 105 on the circuitry side of the second LSI chip 103 are electrically connected to the wiring board 102 via metal fine wires 106.

However, in the known semiconductor device, because of recent remarkable increase in number of pins in an LSI chip, the external electrodes 105 on the second LSI chip 103 are often located almost right over the raised electrodes 104 on the first LSI chip 102 as viewed vertically downward from over the principal surface of the wiring board 101. Thus, during a wire bonding process in which the external electrodes on the second LSI chip 103 are bonded to the wiring board 101, if a load is applied downward vertically to the principal surface of the wiring board 101 with a bonding jig, the raised electrodes 104 and surrounding portions thereof (which will be herein referred to as "flip-chip bonding terminals") are mechanically damaged. As a result, the electrical connection between the first LSI chip 102 and wiring board 101 via the raised electrodes 104 deteriorates due to the mechanical damage or the bonding terminals might be crushed. That is to say, if the thicknesses of the LSI chips 102 and 103 are reduced to 300 μm or less to meet the demand of thinning a semiconductor device, it should be difficult for the thinner LSI chips 102 and 103 to internally attenuate the load applied thereto by the bonding jig.

In addition, even if a low-melting metal with a mechanical strength greater than that of a conductive adhesive or resin is used for the raised electrodes 104, the mechanical strength of the bonding terminals will not increase so much as compared to the bonding terminals made of the conductive adhesive or resin. This is because the size of the raised electrodes 104 is several tens μm at the most.

Further, the first and second LSI chips 102 and 103 are secured together so that their non-circuitry sides face each other. Thus, it is difficult to mount a stack of three or more LSI chips on one wiring board 101. Accordingly, it is not so easy for the know techniques to further improve the performance and further increase packaging density.

SUMMARY OF THE INVENTION

It is therefore an object of the present invention to solve these problems of a semiconductor device with a stack of multiple semiconductor chips. Specifically, a first object of the present invention is to establish more reliable electrical connection by suppressing the deterioration of the flip-chip bonding terminals during a wire bonding process. A second object of the present invention is to get three or more semiconductor chips mounted on a wiring board.

To achieve the first object, a first inventive semiconductor device includes: a wiring board; a first semiconductor chip, which has a circuitry side and a non-circuitry side that face each other vertically and which is electrically connected to the wiring board via a raised electrode, the circuitry side of the first chip facing the principal surface of the wiring board; and a second semiconductor chip, which has a circuitry side and a non-circuitry side that face each other vertically and which includes an external electrode on the circuitry side thereof. The non-circuitry sides of the first and second semiconductor chips are secured to each other. The external electrode of the second semiconductor chip is connected to the wiring board via a metal fine wire. The external and raised electrodes are so disposed as not to overlap each other as viewed vertically downward from over the principal surface of the wiring board.

In the first inventive semiconductor device, the external and raised electrodes are so disposed as not to overlap each other as viewed vertically downward from over the principal surface of the wiring board. Thus, the load applied to the external electrode during a wire bonding process does not propagate to a flip-chip bonding terminal on the first semiconductor chip so easily. As a result, electrical connection does not deteriorate at the flip-chip bonding terminal.

To achieve the second object, a second inventive semiconductor device includes: a wiring board; a first semiconductor chip, which has a circuitry side and a non-circuitry side that face each other vertically and which is electrically connected to the wiring board via a raised electrode, the circuitry side of the first chip facing the principal surface of the wiring board; and at least second and third semiconductor chips, each of which has a circuitry side and a non-circuitry side that face each other vertically and each of which includes an external electrode on the circuitry side thereof. The non-circuitry sides of the second and third semiconductor chips are secured to the non-circuitry side of the first semiconductor chip. The external electrodes of the second and third semiconductor chips are connected to the wiring board via metal fine wires.

In the second inventive semiconductor device, the non-circuitry sides of the second and third semiconductor chips are secured to the non-circuitry side of the first semiconductor chip. Thus, a stack of three or more semiconductor chips can be mounted on the wiring board. As a result, high performance and high packaging density are realized.

To obtain the second object, a third inventive semiconductor device includes: a wiring board; at least first and second semiconductor chips, each of which has a circuitry side and a non-circuitry side that face each other vertically and each of which is electrically connected to the wiring board via a raised electrode, the circuitry sides of the first and second chips facing the principal surface of the wiring board; and a third semiconductor chip, which has a circuitry side and a non-circuitry side that face each other vertically and which includes an external electrode on the circuitry side thereof. The non-circuitry side of the third semiconductor chip is secured to the non-circuitry side of the first semiconductor chip and/or the non-circuitry side of the second semiconductor chip. The external electrode of the third semiconductor chip is connected to the wiring board via a metal fine wire.

The third inventive semiconductor device includes at least the first and second semiconductor chips which are electrically connected to the wiring board via raised electrodes. In this device, the non-circuitry side of the third semiconductor chip is secured to the non-circuitry side of the first semiconductor chip and/or the non-circuitry side of the second semiconductor chip. Thus, a stack of three or more semiconductor chips can be mounted on the wiring board. As a result, high performance and high packaging density are realized.

In the second or third semiconductor device, the external and raised electrodes are preferably so disposed as not to overlap each other as viewed vertically downward from over the principal surface of the wiring board. Then, the load applied to the external electrode during a wire bonding process does not propagate to a flip-chip bonding terminal on the first semiconductor chip so easily. As a result, electrical connection does not deteriorate at the flip-chip bonding terminal. Thus, the first object is also accomplished.

In one embodiment of the present invention, the raised electrode(s) and the wiring board may be secured to each other with a conductive adhesive. Then, the raised electrode(s) and the wiring board can be bonded together with the conductive adhesive at a relatively low temperature of about 100° C. Thus, no thermal stress is created in the first (or second) semiconductor chip or the wiring board. As a result, no mechanical damage is caused due to bending of the chip or the board.

Alternatively, the raised electrode(s) and the wiring board may be secured to each other with a low-melting metal. Then, bonding strength increases between the wiring board and the first (and second) semiconductor chip(s).

As another alternative, the raised electrode(s) may be in direct contact with (an) interconnector electrode(s) formed on the wiring board. Then, even if the raised electrodes are arranged at a narrow pitch on the first (and second) semiconductor chip(s), no electrical short circuit will be caused by any adhesive. As used herein, the interconnector electrodes are parts of the wiring on the wiring board and are bonded to the raised electrodes.

BRIEF DESCRIPTION OF THE DRAWINGS

FIG. 1A is a cross-sectional view of the device and FIG. 1B is a partial plan view thereof.

DESCRIPTION OF THE PREFERRED EMBODIMENTS

Embodiment 1

A first embodiment of the present invention will be described with reference to the drawings.

Figure 1A:
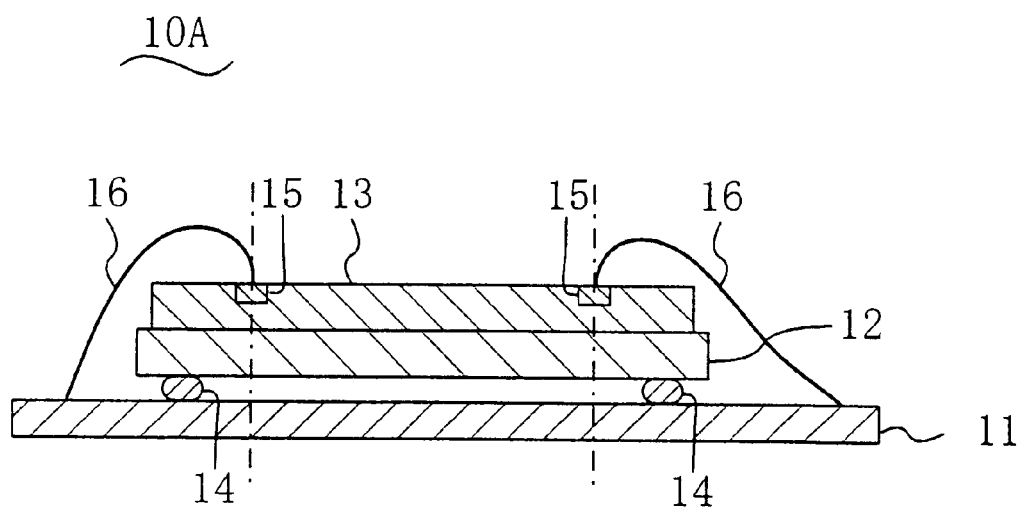
FIGS. 1A and 1B show a semiconductor device according to a first embodiment of the present invention.
Figure 1B:
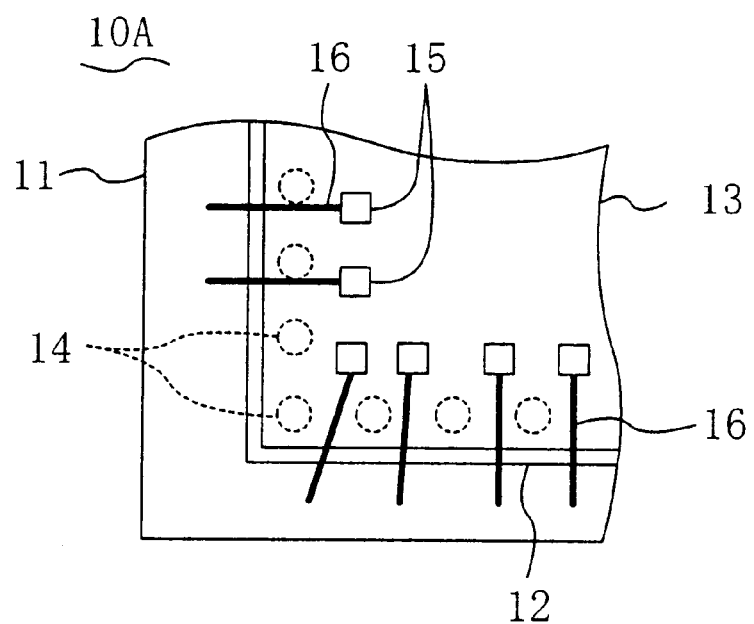

FIGS. 1A and 1B show a semiconductor device according to a first embodiment of the present invention. FIG. 1A illustrates a cross-sectional structure of the device and FIG. 1B illustrates part of a planar layout thereof.

As shown in FIGS. 1A and 1B, the semiconductor device 10A of this embodiment includes: a wiring board 11 of a glass epoxy, which is an epoxy resin containing fiberglass; and first and second LSI chips 12 and 13 mounted on the wiring board. Multiple semiconductor elements have been integrated in each of the first and second LSI chips 12 and 13.

The first and second LSI chips 12 and 13 are secured to each other with an adhesive, for example, so that the non-circuitry sides of the first and second LSI chips 12 and 13 face each other.

The circuitry side of the first LSI chip 12 faces the principal surface of the wiring board 11 and is electrically connected to the wiring board 11 via raised electrodes (bumps) 14 formed on the chip 12. In other words, the fist LSI chip 12 is flip-chip bonded to the wiring board 11.

External electrodes (external terminals or pads) 15 on the circuitry side of the second LSI chip 13 are electrically connected to the wiring on the wiring board 11 via metal fine wires 16.

In the semiconductor device 10A of the first embodiment, the external electrodes 15 on the second LSI chip 13, which are electrically connected to the wiring board 11 via the metal fine wires 16, and the raised electrodes 14 on the first LSI chip 12 are so disposed as not to overlap each other as viewed vertically downward from over the principal surface of the wiring board 11. This direction will be herein referred to as a "perpendicular direction".

According to this disposition, the raised electrodes 14 are way off the direction in which a load applied to the external electrodes 15 on the second LSI chip 13 by a bonding jig when the electrodes 15 are wire-bonded. As a result, the raised electrodes 14 are not mechanically damaged so much as to deteriorate the electrical connection at the flip-chip bonding terminals.

Figure 6:
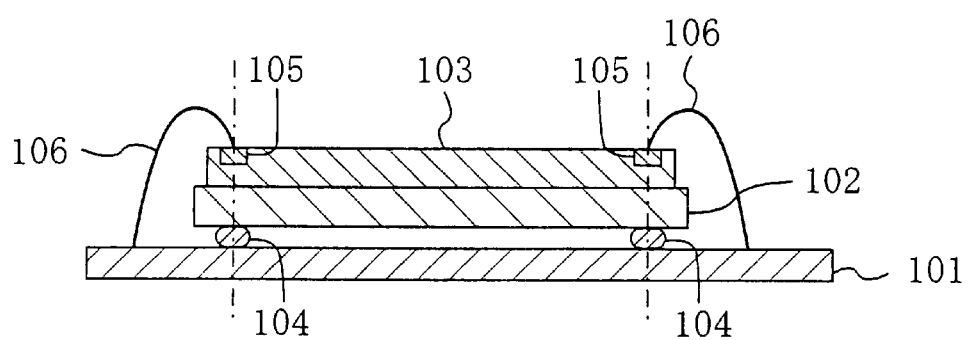
FIG. 6 is a cross-sectional view of a know semiconductor device.

As shown in FIG. 6, the raised electrodes 104 and external electrodes 105 are usually disposed along the periphery of the first and second LSI chips 102 and 103, respectively. Thus, if the LSI chips 102 and 103, stacked vertically over the wiring board 101, have their side faces almost aligned with each other as viewed perpendicularly downward from over the wiring board 101, the raised electrodes 104 and external electrodes 105 often overlap each other in their planar layout.

In contrast, in the first embodiment, the side faces of the LSI chips 12 and 13, stacked vertically over the wiring board 11, may be almost aligned with each other as viewed perpendicularly downward from over the wiring board 11. Even so, when the external electrodes 15 are wire-bonded, the load applied to the raised electrodes 14 should be attenuated. This is because the raised electrodes 14 and external electrodes 15 are so disposed as not to overlap each other as viewed perpendicularly.

The gap between the wiring board 11 and first LSI chip 12 is filled with a resin encapsulant (not shown). Further, the first and second LSI chips 12 and 13 and the metal wires 16 are preferably molded together with the resin encapsulant. Then, the semiconductor device 10A can be protected from external mechanical damage. In addition, it is also possible to suppress the degradation in electrical characteristics of the bonding terminals with time.

Interconnects or external connector electrodes may be formed on either the surface of the wiring board 11, opposite to the surface for mounting the LSI chips 12 and 13 thereon, or any side face of the wiring board 11 to electrically connect the board 11 to a motherboard on which the semiconductor device 10A should be mounted. Conductive balls or pins may be disposed on, and connected to, the external connector electrodes.

Further, the wiring board 11 preferably has a multi-level interconnect structure in which the electrical interconnections are made by vias. Then, even if the raised electrodes 14 are disposed at a narrow pitch on the first LSI chip 12, the wiring board 11 is easily compatible with the first LSI chip 12 having such a structure. As a result, interconnects and electrodes to be connected to the motherboard can be arranged on the wiring board 11 more flexibly.

The LSI chips 12 and 13 may be either memory or logic chips, for example. That is to say, the functions of the LSI chips 12 and 13 are not particularly limited.

Hereinafter, it will be described in detail how to dispose the raised electrodes 14 and external electrodes 15 so that the electrodes 14 and 15 do not overlap each other as viewed perpendicularly from over the wiring board 11.

Specifically, two methods are usable for this purpose. In one of the methods, the raised electrodes 14 and external electrodes 15 on the first and second LSI chips 12 and 13, respectively, are laid out so as not to overlap each other when the chips 12 and 13 are stacked one upon the other. In the other method, the positional relationship among the electrodes is not considered when the chips are designed. Instead, in stacking the chips 12 and 13 one upon the other, the position of the second LSI chip 13 with respect to that of the first LSI chip 12 is finely adjusted in such a manner as not to overlap the electrodes 14 and 15.

For example, in the first method, the raised electrodes 14 and external electrodes 15 may be laid out so as not to overlap each other as viewed perpendicularly downward from over the chips 12 and 13 with the centers of the respective principal surfaces of the first and second LSI chips 12 and 13 aligned with each other. Then, even if the locations of the raised electrodes 14 or external electrodes 15 to be wire-bonded shift to some degree, the electrodes 14 and 15 still do not overlap each other when viewed perpendicularly from over the principal surface of the wiring board 11.

Further, in the first method, the external electrodes 15 on the second LSI chip 13 may be disposed to be located within a polygon whose vertexes are the raised electrodes 14 on the first LSI chip 12 as shown in FIG. 1B. Then, even if the locations of raised electrodes 14 shift to some degree, the raised electrodes 14 and external electrodes 15 still do not overlap each other as viewed perpendicularly from over the principal surface of the wiring board 11.

In the foregoing example, the first and second LSI chips 12 and 13 are of almost the same shapes or sizes. Hereinafter, a semiconductor device in which the first and second LSI chips 12 and 13 have mutually different shapes or sizes will be described with reference to the drawings.

FIGS. 2A through 2D shows exemplary positional relationships between raised electrodes and external electrodes in various situations where the second LSI chip has a different shape or size from that of the first LSI chip in the semiconductor device of first embodiment. FIGS. 2A through 2D are planar layouts in which wiring board is not shown.

Figure 2A:
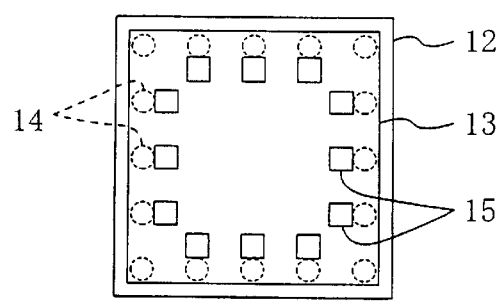
FIGS. 2A through 2D are plan views illustrating exemplary positions of second LSI chips having various shapes or sizes for the semiconductor device of the first embodiment.

In the example shown in FIG. 2A, the first and second LSI chips 12 and 13 are of almost the same shape or size. And the raised electrodes 14 are arranged along the periphery of the first LSI chip 12. As shown in FIG. 2A, the external electrodes 15 may be arranged along the periphery of the second LSI chip 13 and almost inscribed in the square formed by the raised electrodes 14 of the first LSI chip 12.

Figure 2B:
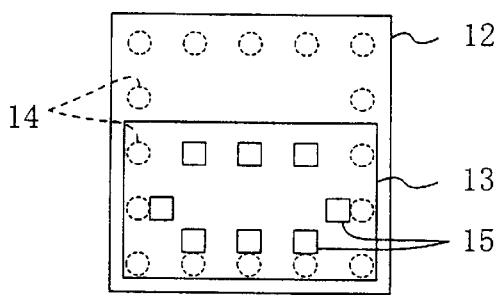

In the example shown in FIG. 2B, the length of the second LSI chip 13 is smaller than that of the first LSI chip 12. As shown in FIG. 2B, some external electrodes 15 of the second LSI chip 13 may be almost inscribed to three of the four sides of the square formed by the raised electrodes 14 of the first LSI chip 12.

Figure 2C:
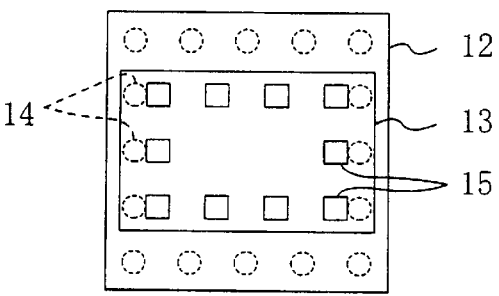

In the example shown in FIG. 2C, the length of the second LSI chip 13 is smaller than that of the first LSI chip 12. As shown in FIG. 2C, some external electrodes 15 of the second LSI chip 13 may be almost inscribed to a pair of opposite sides of the square formed by the raised electrodes 14 of the first LSI chip 12. Although not shown, some external electrodes 15 may also be almost inscribed to a pair of adjacent sides including a corner of the square formed by the raised electrodes 14.

Figure 2D:
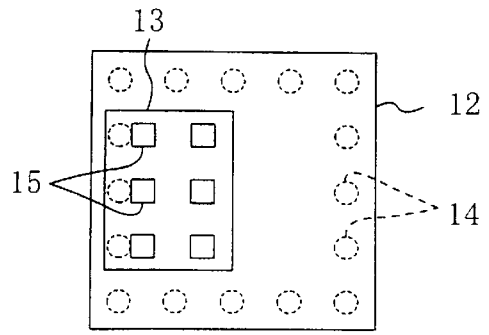

In the example shown in FIG. 2D, the length and width of the second LSI chip 13 are smaller than those of the first LSI chip 12. As shown in FIG. 2D, some external electrodes 15 of the second LSI chip 13 may be almost inscribed to one side of the square formed by the raised electrodes 14 of the first LSI chip 12.

In any of the arrangement shown in FIGS. 2A through 2D, the external electrodes 15 and raised electrodes 14 do not overlap each other as viewed perpendicularly from over the chips. Consequently, the load applied to the external electrodes 15 during the wire bonding process does not propagate to the raised electrodes 14 so much.

Hereinafter, it will be described with reference to FIG. 3 how the load applied to an external electrode 15 on the second chip 13 during the wire bonding process propagates to a raised electrode 14.

Figure 3:
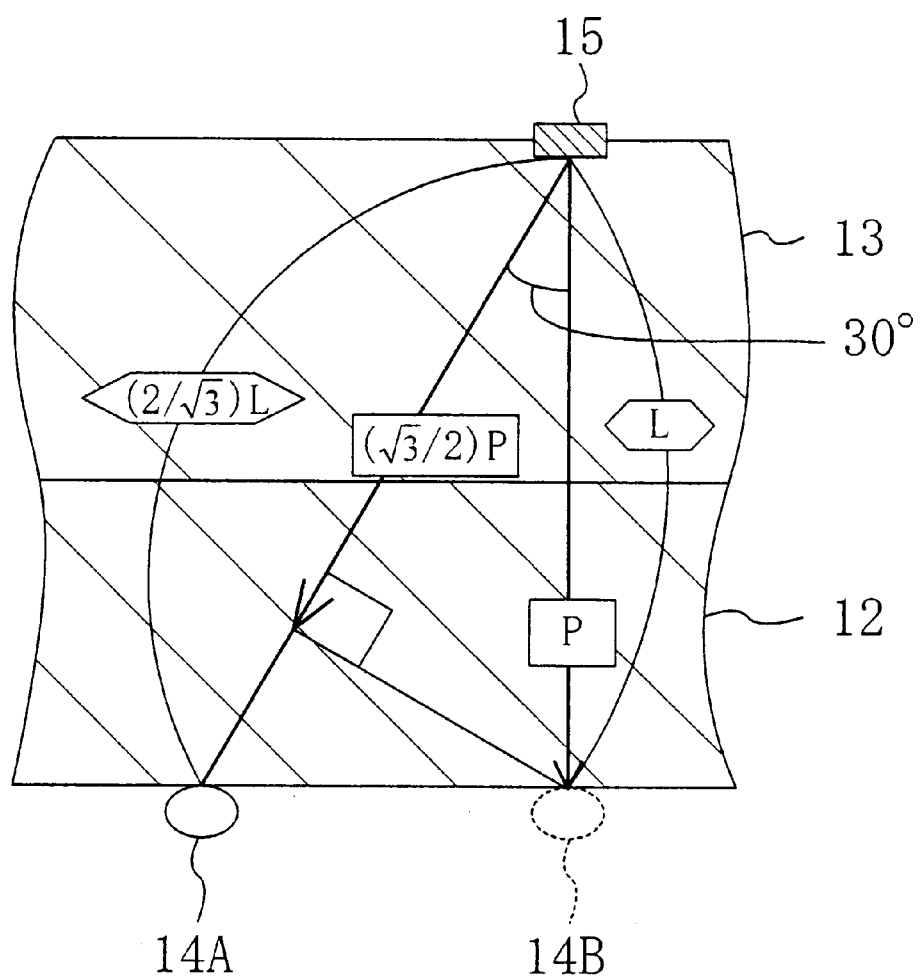
FIG. 3 is a partial cross-sectional view showing the directions and magnitudes of the loads applied during a wire bonding process for a cross section taken vertically to the principal surface of a stack of LSI chips for the semiconductor device of the first embodiment.

FIG. 3 shows the directions and magnitudes of the loads applied to the electrodes during the wire bonding process as vectors for a cross section taken vertically to the principal surface of the stack of LSI chips. In FIG. 3, each member already shown in FIG. 1 is identified by the same reference numeral and the description thereof will be omitted herein.

As shown in FIG. 3, suppose a raised electrode 14A is disposed to form an angle of 30 degrees with a line extending vertically from an external electrode 15 on the chip 13 to the surface of the second LSI chip 13.

In this case, supposing the magnitude of the load applied vertically downward is P, a component of the load applied in the direction forming the angle of 30 degrees with the vertical direction is $\{(\sqrt{3})/2\}P$, which is smaller than P. Further, as to the distance (propagation distance) between the external electrode 15 and raised electrode 14, suppose the distance between the external electrode 15 and a comparative raised electrode 14B located right under the electrode 15 is L. The distance from the external electrode 15 to raised electrode 14A, forming the angle of 30 degrees with the line extending vertically from the electrode 15, is $(2/\sqrt{3})L$, which is $(2/\sqrt{3})L$ times as great as the distance L. Accordingly, a decreased load is applied to the raised electrode 14A during the wire bonding process. As a result, the mechanical damage done on the flip-chip bonding terminals can be reduced.

As described above, the flip-chip bonding terminals including the raised electrodes 14A receive a decreased load and are located farther away from the external electrodes 15. Thus, the mechanical damage done on the terminals during the wire bonding process can be reduced. As a result, in the semiconductor device 10A of this embodiment, reliability improves greatly at the electrical bonding terminals.

In the first embodiment, the raised electrodes 14A are so located as to form an angle of 30 degrees with a normal for the surface of the external electrodes 15. Alternatively, any other angle may be selected so long as the raised electrodes 14A can be mounted on the first LSI chip 12.

Embodiment 2

Hereinafter, a second embodiment of the present invention will be described with reference to the drawings.

Figure 4:
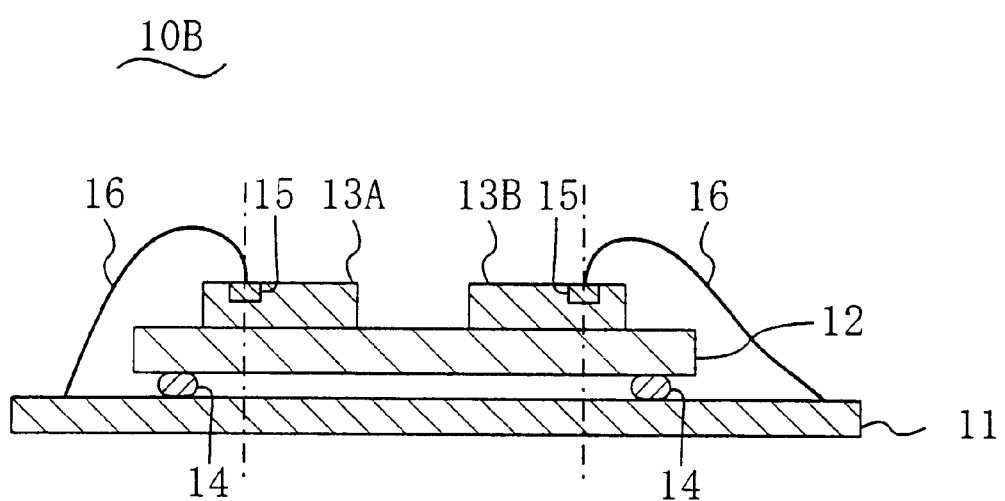
FIG. 4 is a cross-sectional view of a semiconductor device according to a second embodiment of the present invention.

FIG. 4 illustrates a cross-sectional structure of a semiconductor device according to the second embodiment. In FIG. 4, each member already shown in FIG. 1 is identified by the same reference numeral and the description thereof will be omitted herein.

As shown in FIG. 4, the semiconductor device 10B of the second embodiment includes: a first LSI chip 12, which has been flip-chip bonded to a wiring board 11 via raised electrodes 14; and second and third LSI chips 13A and 13B, which have been mounted side by side on the first LSI chip 12. External electrodes 15 are so disposed on each of the second and third LSI chips 13A and 13B as not to overlap the raised electrodes 14 on the first LSI chip 12 as viewed perpendicularly from over the principal surface of the wiring board 11.

As described for the first embodiment, two methods are usable for not overlapping the external and raised electrodes 15 and 14 each other in their planar layout. Specifically, in one of the methods, the electrodes on the first, second and third LSI chips 12, 13A and 13B are laid out so as not to overlap one another when the chips 12 and 13A or 13B are stacked one upon the other. In the other method, in mounting the second or third LSI chip 13A or 13B on the first LSI chip 12, the position of the chip 13A or 13B with respect to that of the chip 12 is finely adjusted in such a manner as not to overlap the electrodes 14 and 15.

In the second embodiment, the mechanical damage done on the flip-chip bonding terminals between the first LSI chip 12 and wiring board 11 can be reduced when the second and third LSI chips 13A and 13B are wire-bonded. Further, since the device of the second embodiment includes the second and third LSI chips 13A and 13B, the device can have its performance and packaging density greatly improved in the device of the second embodiment compared to that of the first embodiment.

The second and third LSI chips 13A and 13B may be laid out as in the example shown in FIG. 2D, considering the difference in shape or size between the chips.

Two chips are not necessarily laid out at the second level. Alternatively, three or more second-level chips may be mounted on the LSI chip 12 at the first level.

Embodiment 3

Hereinafter, a third embodiment of the present invention will be described with reference to the drawing.

Figure 5:
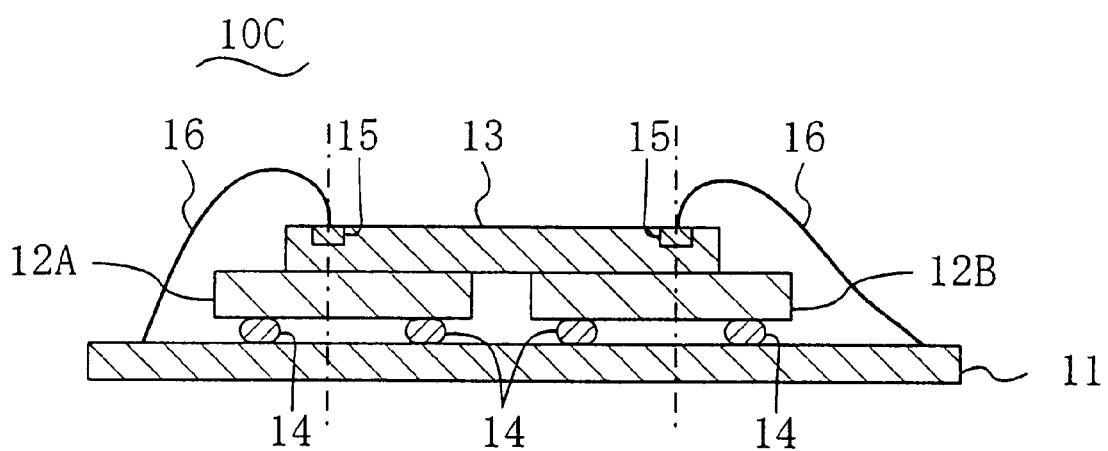
FIG. 5 is a cross-sectional view of a semiconductor device according to a third embodiment of the present invention.

FIG. 5 illustrates a cross-sectional structure of a semiconductor device according to the third embodiment. In FIG. 5, each member already shown in FIG. 1 is identified by the same reference numeral and the description thereof will be omitted herein.

As shown in FIG. 5, the semiconductor device 10C of the third embodiment includes: first and second LSI chips 12A and 12B, which have been flip-chip bonded to a wiring board 11 via raised electrodes 14; and a third LSI chip 13, which has been mounted on the first and second LSI chips 12A and 12B to overlap with the chips 12A and 12B. External electrodes 15 are so disposed on the third LSI chip 13 as not to overlap the raised electrodes 14 on the first and second LSI chips 12A and 12B as viewed perpendicularly from over the principal surface of the wiring board 11.

To avoid the overlap of the external and raised electrodes 15 and 14 in their planar layout, two methods are usable. Specifically, in one of the methods, the electrodes on the first, second and third LSI chips 12A, 12B and 13 are laid out so as not to overlap one another when the chips 12A or 12B and 13 are stacked one upon the other. In the other method, in mounting the third LSI chip 13 on the first and second LSI chips 12A and 12B, the position of the third LSI chip 13 with respect to those of the first and second LSI chips 12A and 12B is finely adjusted in such a manner as not to overlap the electrodes 14 and 15.

In the third embodiment, the mechanical damage done on the flip-chip bonding terminals between the first LSI chip 12A and wiring board 11 and between the second LSI chip 12B and wiring board 11 can be reduced when the third LSI chip 13 is wire-bonded. Further, since the device of the third embodiment includes the first and second LSI chips 12A and 12B, the device can have its performance and packaging density greatly improved compared to the first embodiment.

Two chips are not necessarily disposed at the first level. Alternatively, on three or more chips at the first level, an LSI chip at the second level may be mounted. Further, multiple LSI chips may be also disposed at the second level.

In addition, the LSI chip at the second level does not have to overlap with all of the LSI chips at the first level. Alternatively, the LSI chip at the second level may overlap with at least one of the LSI chips at the first level.

In the first through third embodiments, if a conductive adhesive is used for the flip-chip bonding terminals between the wiring board 11 and first LSI chip 12, the board 11 and chip 12 can be bonded together when heated to a temperature of about 100° C. Thus, no thermal stress is created in any of the LSI chips 12 and 13 or the wiring board 11, and the chips 12 and 13 and wiring board 11 do not bend. As a result, no mechanical damage is caused by the heat treatment.

In the first through third embodiments, if a low-melting metal, e.g., an alloy containing lead and tin or an alloy containing silver (Ag), bismuth (Bi), nickel (Ni) and zinc (Zn), is used for the raised electrodes 14, the bonding strength increases compared to other bonding methods.

Further, in a situation where the raised electrodes 14 are directly connected to interconnector electrodes on the wiring board 11, i.e., the first LSI chip 12 is flip-chip bonded to the wiring board 11, even if the electrodes 14 are arranged at a narrow pitch on the first LSI chip 12, no electrical short circuit will be caused by any adhesive.

What is claimed is:

1. A semiconductor device comprising:

a wiring board;

a first semiconductor chip having a thickness of 300 μm or lower, which has a circuitry side and a non-circuitry side that face each other vertically and which is electrically connected to the wiring board via a raised electrode, the circuitry side of the first chip facing the principal surface of the wiring board; and a second semiconductor chip having a thickness of 300 μm or lower, which has a circuitry side and a non-circuitry side that face each other vertically and which includes an external electrode on the circuitry side thereof, wherein the non-circuitry sides of the first and second semiconductor chips are secured to each other, and wherein the external electrode of the second semiconductor chip is connected to the wiring board via a metal fine wire, and wherein the external and raised electrodes are so disposed as not to overlap each other as viewed vertically downward from over the principal surface of the wiring board.

2. The device of claim 1, wherein the raised electrode is in direct contact with the principle surface of the wiring board.

* * * * *